US008595557B2

(12) United States Patent
Jasinski et al.

(10) Patent No.: US 8,595,557 B2
(45) Date of Patent: Nov. 26, 2013

(54) METHOD AND APPARATUS FOR VERIFYING MEMORY TESTING SOFTWARE

(75) Inventors: Eric Jasinski, Williston, VT (US); Michael Richard Ouellette, Westford, VT (US); Jeremy Paul Rowland, Savannah, GA (US)

(73) Assignee: International Business Machines Corporation, Armonk, NY (US)

( * ) Notice: Subject to any disclaimer, the term of this patent is extended or adjusted under 35 U.S.C. 154(b) by 743 days.

(21) Appl. No.: 10/906,508

(22) Filed: Feb. 23, 2005

(65) Prior Publication Data

US 2006/0190788 A1     Aug. 24, 2006

(51) Int. Cl.
G06F 11/00     (2006.01)

(52) U.S. Cl.
USPC ................ 714/36; 714/43; 714/48; 714/704; 714/25; 714/733; 709/213

(58) Field of Classification Search
USPC ......... 714/720, 747, 733, 36, 43, 48, 704, 25; 709/213
See application file for complete search history.

(56) References Cited

U.S. PATENT DOCUMENTS

| | | | | |
|---|---|---|---|---|
| 5,878,050 A | * | 3/1999 | Brahme et al. | 714/719 |
| 5,912,901 A | * | 6/1999 | Adams et al. | 714/733 |
| 6,393,594 B1 | * | 5/2002 | Anderson et al. | 714/738 |
| 6,499,120 B1 | * | 12/2002 | Sommer | 714/723 |
| 6,643,807 B1 | * | 11/2003 | Heaslip et al. | 714/719 |
| 6,820,047 B1 | * | 11/2004 | Aizawa et al. | 703/14 |
| 2001/0034824 A1 | * | 10/2001 | Mukherjee et al. | 712/215 |
| 2001/0034854 A1 | * | 10/2001 | Mukherjee | 714/5 |
| 2003/0167428 A1 | * | 9/2003 | Gold | 714/720 |
| 2004/0024729 A1 | * | 2/2004 | Worley | 707/1 |
| 2004/0117562 A1 | * | 6/2004 | Wu et al. | 711/147 |
| 2004/0117563 A1 | * | 6/2004 | Wu et al. | 711/150 |
| 2004/0117579 A1 | * | 6/2004 | Wu et al. | 711/170 |
| 2004/0117580 A1 | * | 6/2004 | Wu et al. | 711/170 |
| 2004/0123192 A1 | * | 6/2004 | Caty et al. | 714/718 |
| 2004/0179403 A1 | * | 9/2004 | Noguchi et al. | 365/185.22 |
| 2004/0221140 A1 | * | 11/2004 | Filippo et al. | 712/225 |
| 2004/0230870 A1 | * | 11/2004 | Wang et al. | 714/30 |
| 2005/0057968 A1 | * | 3/2005 | Lutze et al. | 365/185.18 |
| 2005/0071723 A1 | * | 3/2005 | Luick | 714/747 |

* cited by examiner

Primary Examiner — Joshua P Lottich
Assistant Examiner — Jeison C Arcos
(74) Attorney, Agent, or Firm — Yudell Isidore Ng Russell PLLC

(57) ABSTRACT

A method for verifying the accuracy of memory testing software is disclosed. A built-in self test (BIST) fail control function is utilized to generate multiple simulated memory fails at various predetermined locations within a memory array of a memory device. The memory array is then tested by a memory tester. Afterwards, a bit fail map is generated by the logical-to-physical mapping software based on all the memory fails indicated by the memory tester. The bit fail map provides all the fail memory locations derived by the logical-to-physical mapping software. The fail memory locations derived by the logical-to-physical mapping software are then compared to the predetermined memory locations to verify the accuracy of the logical-to-physical mapping software.

21 Claims, 4 Drawing Sheets

METHOD AND APPARATUS FOR VERIFYING MEMORY TESTING SOFTWARE

BACKGROUND OF THE INVENTION

1. Technical Field

The present invention relates to software tools in general, and, in particular, to a software tool for verifying memory testing software. Still more particularly, the present invention relates to a method and apparatus for verifying the accuracy of logical-to-physical mapping software.

2. Description of Related Art

Conceptually speaking, diagnosing failures in a memory device is fairly straightforward. Basically, after a memory tester has detected a failure in a memory device, the logical address of the failed memory location is translated into a corresponding physical location within the memory device. Such translation is commonly known as a logical-to-physical translation and is typically performed by a logical-to-physical mapping software. Once the failed physical location of the memory device is known, different analyses can be performed. For example, photographic data of the memory device can be compared to the physical location obtained by a tester to determine whether or not they correlate to the same location.

Methods for obtaining failed logical addresses of memory devices during memory testings are well-known in the art. For stand-alone memory devices, the logical addresses are already known by memory testers. For memory devices utilizing built-in self-test (BIST), several schemes have been developed for translating what memory testers know (typically in cycle numbers) into corresponding logical addresses.

The major problem in memory testings lies upon the inability to verify whether or not the logical-to-physical mapping software is functioning correctly. There are several points within the logical-to-physical mapping software at which errors can be introduced. For example, memory designers may mis-communicate the logical-to-physical algorithm description to software engineers who write the logical-to-physical mapping software. Also, the cycle delays from the time a memory fail occurred to the time the memory fail being detected are usually not accounted for. In addition, during a cycle in which a memory tester observed the fail, test data are not corrected for cycle offsets due to counters (such as whether it starts at 0 or 1) and for any operations that take place before memory test begins (e.g., a "reset" operation).

The prior art solution to the above-mentioned problem is to test memory devices that come off a manufacturing line early in the life of the process (often as a special-purpose test chip) and generate a bit-fail map (BFM) of the failing memory cells. Memory designers then look at the BFM and identify the likely locations for a physical defect that could cause the memory failure. The failed memory device is then sent to failure analysis where it is stripped down to the circuit layers that include the memory and then the locations identified by the memory designers are observed. If an abnormality is found, it is assumed that the abnormality is a defect that caused the memory failure. With such methodology, however, only by physically observing multiple defects with high accuracies can any level of confidence be achieved. In practice, frequently no defect is observed at the location that casts doubt on the logical-to-physical mapping software.

Consequently, it would be desirable to provide an improved method for verifying logical-to-physical mapping software that is convenient and relatively inexpensive to implement.

SUMMARY OF THE INVENTION

In accordance with a preferred embodiment of the present invention, a built-in self test (BIST) fail control function is utilized to generate multiple simulated memory fails at various predetermined locations within a memory array of a memory device. The memory array is then tested by a memory tester. Afterwards, a bit fail map is generated by the logical-to-physical mapping software based on all the memory fails indicated by the memory tester. The bit fail map provides all the fail memory locations derived by the logical-to-physical mapping software. The fail memory locations derived by the logical-to-physical mapping software are then compared to the predetermined memory locations to verify the accuracy of the logical-to-physical mapping software.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
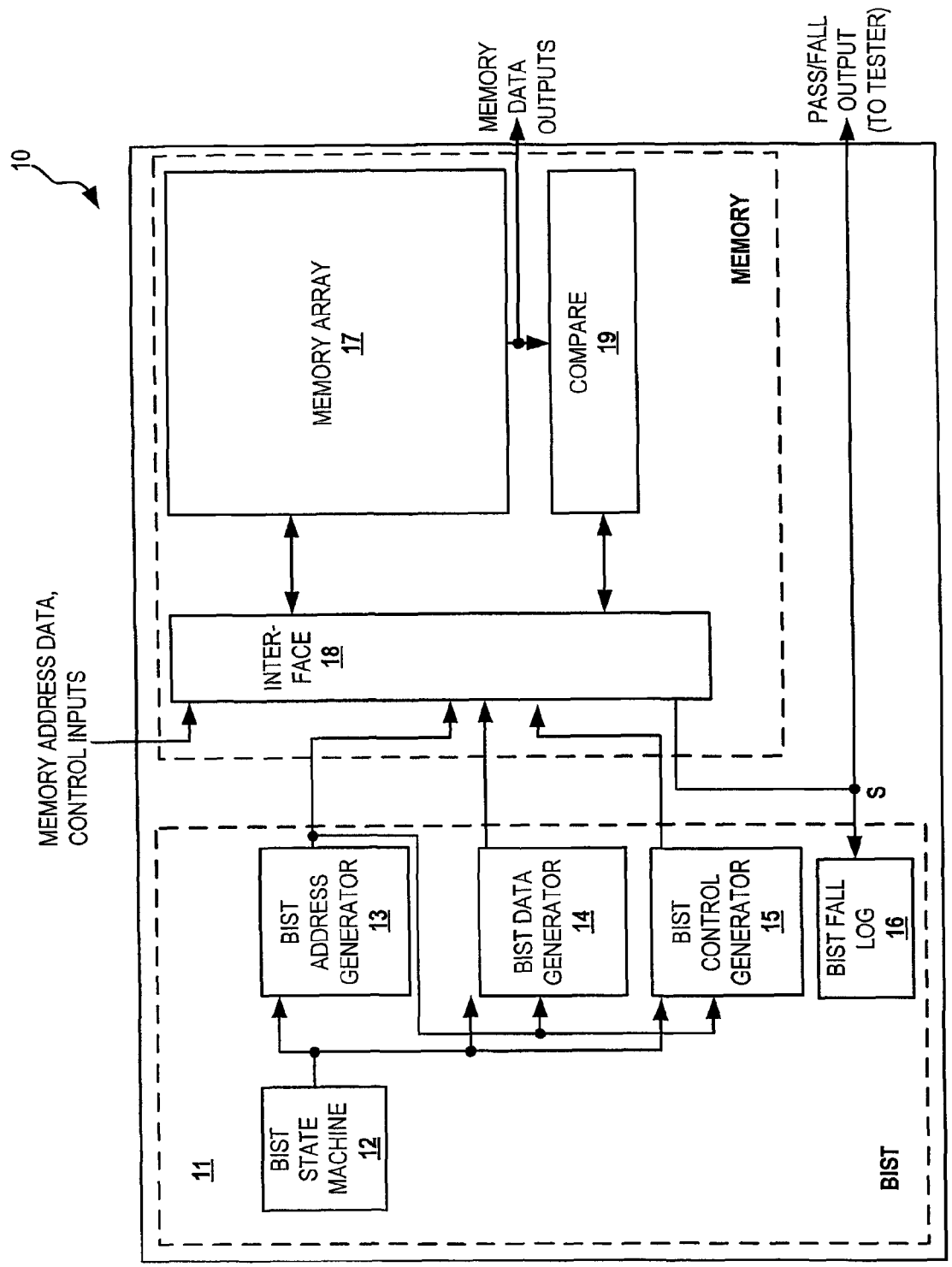
FIG. 1 is a block diagram of a built-in self-test (BIST) configuration within a memory device, according to the prior art.

Referring now to the drawings and in particular to FIG. 1, there is illustrated a block diagram of a built-in self-test (BIST) configuration within a memory device, according to the prior art. As shown, a BIST 11 is coupled to a memory array 17 via an interface 18 within a memory device 10. BIST 11 includes a BIST state machine 12 for controlling a BIST address generator 13, a BIST data generator 14 and a BIST control generator 15. BIST 11 tests memory array 17 by performing a series of read and write operations on memory array 17 in sequences that are well-known to those skilled in the art. After comparing the expected data from BIST 11 to the actual data coming from memory array 17 from a read operation, a compare module 19 generates a pass/fail signal S to indicate whether or not there is a match. Pass/fail signal S is recorded in a BIST fail log 16. At the end of a BIST sequence, BIST fail log 16 can be used to determine if a memory fail occurred at any time during the BIST sequence.

Pass/fail signal S can also be observed continuously during the BIST sequence via a memory tester. Each read or write operation that results in a fail is recorded by the memory tester, and the results are then translated by logical-to-physical mapping software into a graphic image of memory array 17, such as bit-fail map (BFM), with the failing locations in memory array 17 being identified. As mentioned previously, the logical-to-physical mapping software for such translation process is prone to errors.

In accordance with a preferred embodiment of the present invention, a failure-inducing circuit that can cause a memory array to appear to fail at a specific memory address is coupled to a memory array when the memory array is being tested. The failure-inducing circuit allows any memory address on the memory array to exhibit a simulated memory fail. The failure-inducing circuit can be turned on or off at will by a memory tester, and the simulated memory fail can be observed by the memory tester. At the end of a BIST sequence, the known simulated fail memory locations caused by the failure-inducing circuit are compared with the BFM generated by the logical-to-physical mapping software to verify the integrity of the logical-to-physical software.

Figure 2:
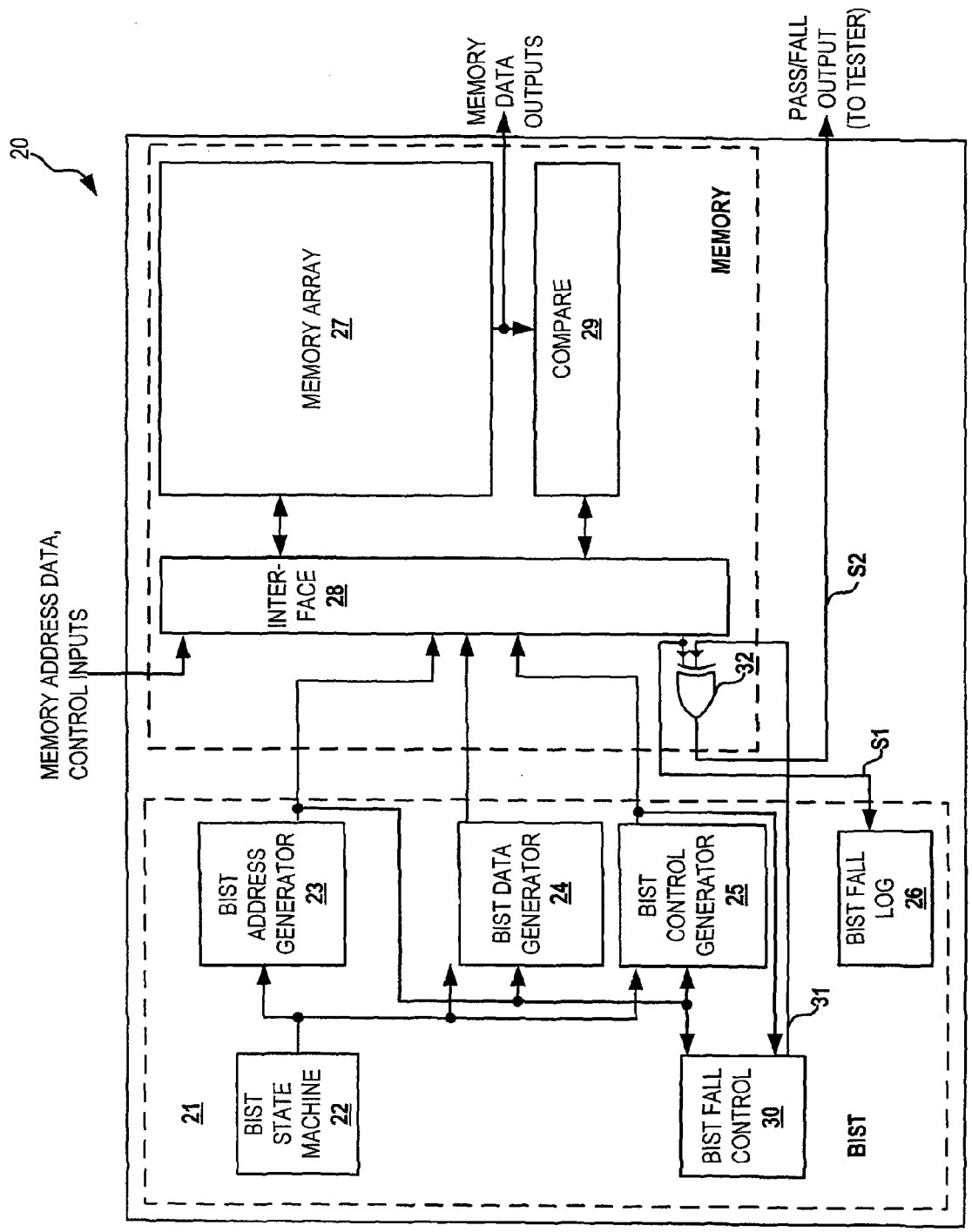
FIG. 2 is a block diagram of a BIST configuration within a memory device, in accordance with a preferred embodiment of the present invention.

With reference now to FIG. 2, there is illustrated a block diagram of a BIST configuration within a memory device, in accordance with a preferred embodiment of the present invention. As shown, a BIST 21 is coupled to a memory array 27 via an interface 28 within a memory device 20. BIST 21 includes a BIST state machine 22 for controlling a BIST address generator 23, a BIST data generator 24 and a BIST control generator 25. BIST 21 tests memory array 27 by performing a series of read and write operations on memory array 27 in sequences that are well-known to those skilled in the art. After comparing the expected data from BIST 21 to the actual data coming from memory array 27 from a read operation, a compare module 29 generates a pass/fail signal S1 to indicate whether or not there is a match.

BIST 21 also includes a BIST fail control block 30 for monitoring BIST address and control signals from various BIST components such as BIST address generator 23, BIST data generator 24 and BIST control generator 25. BIST fail control block 30 can cause any memory location within memory array 27 to exhibit a simulated memory fail. BIST fail control block 30 can preferably be turned on or off by a memory tester (not shown) external to memory device 20.

Figure 3:
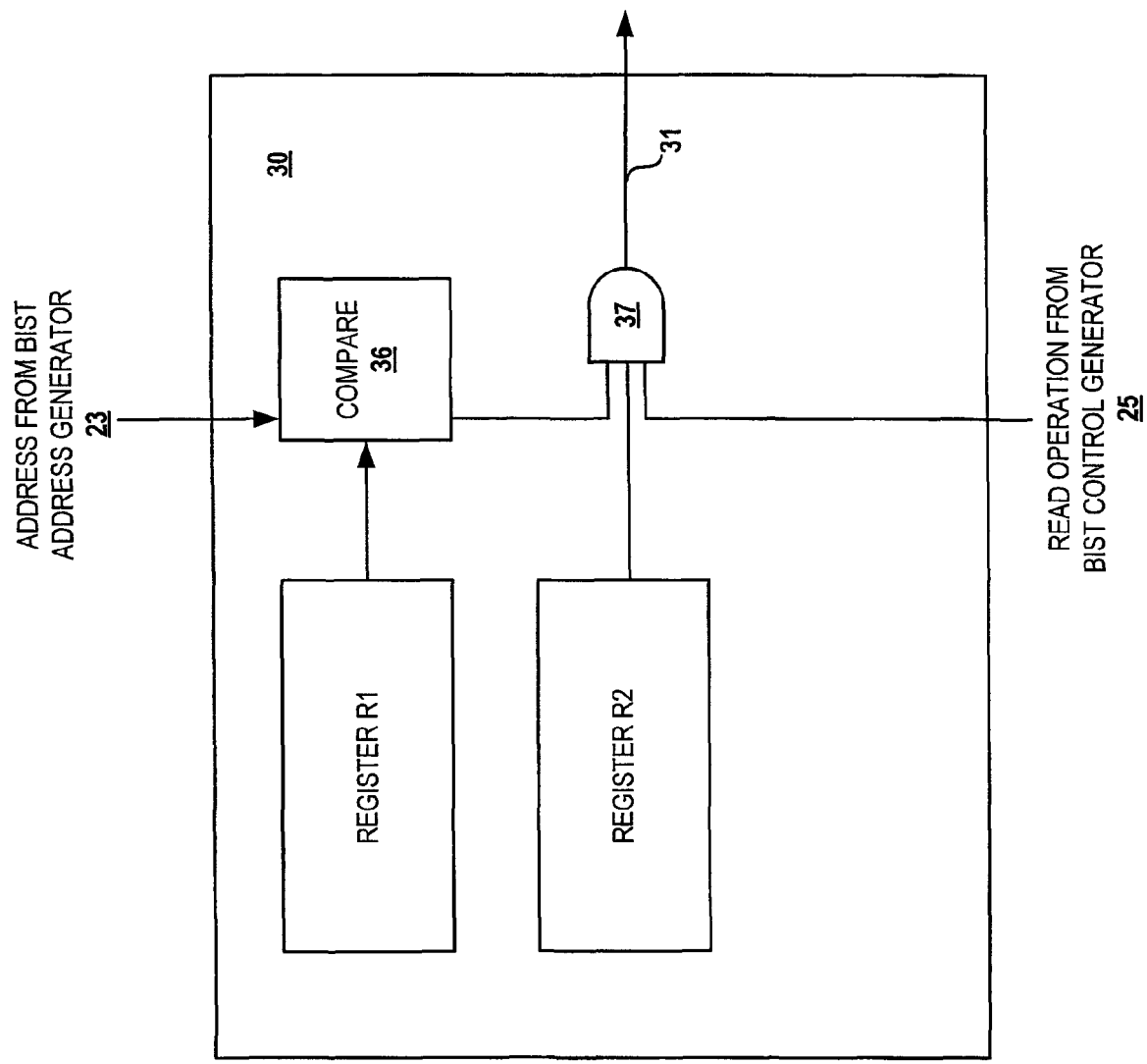
FIG. 3 is a block diagram of a BIST fail control block, in accordance with a preferred embodiment of present invention.

Referring now to FIG. 3, there is depicted a block diagram of BIST fail control block 30, in accordance with a preferred embodiment of present invention. BIST fail control block 30 includes a first register R1 and a second register R2. Before the performance of a BIST sequence, first register R1 can be programmed with a specific memory address for which a simulated memory fail is desired to occur within memory array 27. Second register R2 is a single bit register for controlling whether or not a simulated memory fail should be induced for the memory address stored in first register R1.

During the performance of a BIST sequence, memory addresses generated by BIST address generator 23 (from FIG. 2) are compared with the memory address stored in first register R1 via a comparator 36. Preferably, comparator 36 outputs a logical "0" when the memory address generated by BIST address generator 23 is not the same as the memory address stored in first register R1, and outputs a logical "1" when the memory address generated by BIST address generator 23 is the same as the memory address stored in first register R1.

As mentioned above, the bit stored within second register R2 indicates whether or not a simulated memory fail should be induced for the memory address stored in first register R1. Preferably, second register R2 outputs a logical "0" when a simulated memory fail is not desired for the memory address stored in first register R1, and outputs a logical "1" when a simulated memory fail is desired for the memory address stored in first register R1. The memory address in first register R1 and the bit in second register R2 can be loaded by a memory tester before or during the performance of a BIST sequence.

BIST control generator 25 provides a logical "1" to BIST fail control block 30 when BIST 21 is performing a read operation to memory array 27, and provides a logical "0" to BIST fail control block 30 when BIST 21 is not performing a read operation to memory array 27. By combining the outputs from comparator 36, second register R2 and BIST control generator 25, a three-input logic AND gate 37 generates an output signal to XOR gate 32 (from FIG. 2) via a line 31. Basically, three-input logic AND gate 37 generates a logical "1" signal to XOR gate 32 only when the outputs from comparator 36, second register R2 and BIST control generator 25 are all logical "1"s. A logical "1" signal from BIST fail control 30 means that BIST fail control block 30 intends to apply a simulated memory fail at the address stored within first register R1.

As shown in FIG. 2, XOR logic gate 32 combines the output signal from BIST fail control block 30 and pass/fail signal S1 from compare module 29 to form a second pass/fail signal S2. Preferably, pass/fail signal S1 is a logical "1" when there is a memory fail detected in a corresponding memory address within memory array 27, and pass/fail signal S1 is a logical "0" when there is no memory fail detected in a corresponding memory address within memory array 27. Second pass/fail signal S2 is then sent to a memory tester.

In order to verify the accuracy of a memory testing software, BIST 21 runs two testing passes for memory array 27. During the first testing pass, BIST 21 sequentially runs through a predetermined sequence of cycles while the memory tester collects the cycle numbers of the failing cycles. During the second testing pass, BIST 21 sequentially runs through the same sequences of cycles as in the first testing pass, but simulated memory fails for various memory addresses are methodically injected to the test information by BIST fail control block 30. With the present implementation, second pass/fail signal S2 is a logical "1" for each simulated memory fail for an associated memory address. Such information are then sent the memory tester.

After the completion of the BIST sequence, the memory fail information gathered by the memory tester are then translated by the logical-to-physical mapping software. The translated memory fail address locations are subsequently compared with the known simulated memory fail address locations to determine if they correspond with each other. If any of the translated memory fail address locations does not correspond with the corresponding known simulated memory fail address location, then the logical-to-physical mapping software can be concluded to be defective and appropriate corrections should be taken.

As has been described, the present invention provides a method for verifying the accuracy memory testing software.

Figure 4:
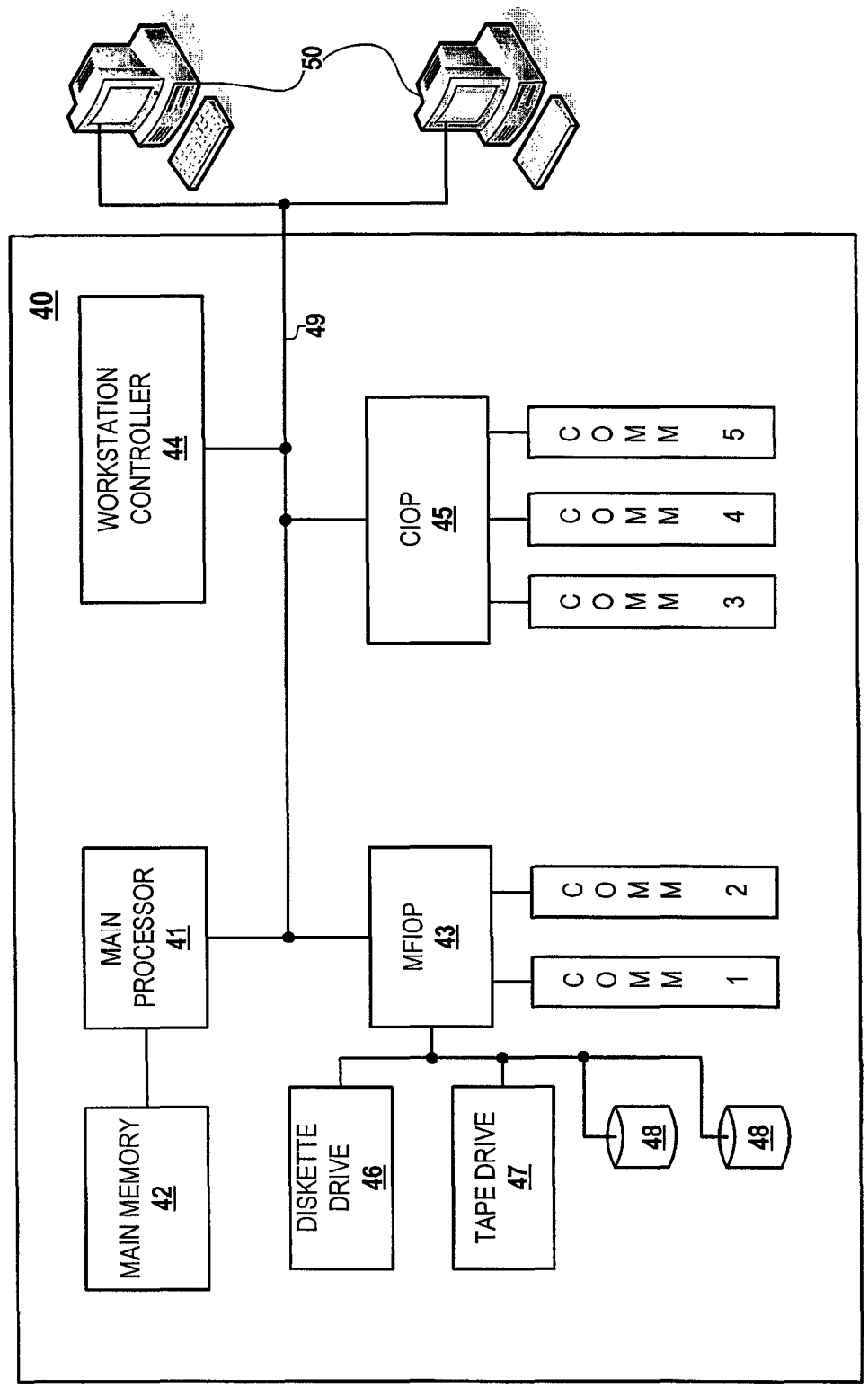
FIG. 4 is a block diagram of a computer system for testing memory devices, in accordance with a preferred embodiment of the present invention.

With reference now to FIG. 4, there is depicted a block diagram of a computer system for testing memory devices, in accordance with a preferred embodiment of the present invention. As shown, a computer system 40 includes a main processor 41 coupled to a main memory 42 and a multiple-function I/O processor (MFIOP) 43. Main processor 41 may include a single processor or multiple processors. Several peripheral storage devices, such as a diskette drive 46, a tape drive 47, and a direct access storage devices (DASDs) 48, are controlled by MFIOP 43. In addition, MFIOP 43 provides communications to other devices via communication ports such as COMM 1 and COMM 2.

A workstation controller 44 is coupled to a communications I/O processor (CIOP) 45 via a system bus 49. Workstation controller 44 provides communications between main processor 41 and workstations 50 that may be connected to computer system 40. CIOP 45 provides communications to other devices via communication ports such as COMM3, COMM4, and COMM5.

Although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for verifying the accuracy of logical-to-physical mapping software designed for testing memory devices, said method comprising:
   providing a built-in self test (BIST) fail control function to generate multiple simulated memory fails at various predetermined memory locations within a memory array of a memory device;
   testing said memory array via a memory tester;
   generating a bit fail map by said logical-to-physical mapping software based on all memory fails indicated by said memory tester, wherein said bit fail map indicates physical locations of all fail memory locations derived by said logical-to-physical mapping software; and
   comparing said fail memory locations derived by said logical-to-physical mapping software to said various predetermined memory locations to verify the accuracy of said logical-to-physical mapping software, and concluding said logical-to-physical mapping software as defective when said fail memory locations derived by said logical-to-physical mapping software do not match up with said various predetermined memory locations.

2. The method of claim 1, wherein said method further includes providing a first register in said BIST fail control function to store said various predetermined memory locations of said simulated memory fails.

3. The method of claim 1, wherein said method further includes providing a second register in said BIST fail control function to store a bit for indicating whether or not a simulated memory fail should be induced.

4. The method of claim 3, wherein said method further includes inducing a simulated memory fail only during a read operation of said memory array.

5. The method of claim 1, wherein said testing further includes
   sequentially executing a predetermined sequence of BIST cycles on said memory array while collecting cycle numbers of all failing BIST cycles on said memory array; and
   sequentially executing said predetermined sequences of BIST cycles while injecting said multiple simulated memory fails at said predetermined locations within said memory array.

6. The method of claim 1, wherein said method further includes generating a simulated memory fail signal by combining a signal from said memory array and a signal from said BIST fail control function.

7. The method of claim 6, wherein said combining further includes XORing a signal from said memory array and a signal from said BIST fail control function.

8. A computer storage medium having a computer program product for verifying the accuracy of logical-to-physical mapping software designed for testing memory devices, said computer storage medium comprising:
   computer program code for utilizing a built-in self test (BIST) fail control function to generate multiple simulated memory fails at various predetermined memory locations within a memory array of a memory device;
   computer program code for testing said memory array via a memory tester;
   computer program code for generating a bit fail map by said logical-to-physical mapping software based on all memory fails indicated by said memory tester, wherein said bit fail map indicates physical locations of all fail memory locations derived by said logical-to-physical mapping software; and
   computer program code for comparing said fail memory locations derived by said logical-to-physical mapping software to said various predetermined memory locations to verify the accuracy of said logical-to-physical mapping software, and for concluding said logical-to-physical mapping software as defective when said fail memory locations derived by said logical-to-physical mapping software do not match up with said various predetermined memory locations.

9. The computer storage medium of claim 8, wherein said computer storage medium further includes computer program code for providing a first register in said BIST fail control function to store said various predetermined memory locations of said simulated memory fails.

10. The computer storage medium of claim 8, wherein said computer storage medium further includes computer program code for providing a second register in said BIST fail control function to store a bit for indicating whether or not a simulated memory fail should be induced.

11. The computer storage medium of claim 10, wherein said computer storage medium further includes computer program code for inducing a simulated memory fail only during a read operation of said memory array.

12. The computer storage medium of claim 8, wherein said computer program code for testing further includes
   computer program code for sequentially executing a predetermined sequence of BIST cycles on said memory array while collecting cycle numbers of all failing BIST cycles on said memory array; and
   computer program code for sequentially executing said predetermined sequences of BIST cycles while injecting said multiple simulated memory fails at said predetermined locations within said memory array.

13. The computer storage medium of claim 8, wherein said computer storage medium further includes computer program code for generating a simulated memory fail signal by combining a signal from said memory array and a signal from said BIST fail control function.

14. The computer storage medium of claim 13, wherein said computer program code for combining further includes computer program code for XORing a signal from said memory array and a signal from said BIST fail control function.

15. An apparatus for verifying the accuracy of logical-to-physical mapping software designed to test integrated circuit memory devices, said apparatus comprising:
- a built-in self test (BIST) fail control module within a BIST unit for generating a plurality of simulated memory fails at various predetermined memory locations within a memory array of a memory device;
- a memory tester for testing said memory array;
- means for utilizing said logical-to-physical mapping software to generate a bit fail map based on all memory fails indicated by said memory tester, wherein said bit fail map indicates physical locations of all fail memory locations derived by said logical-to-physical mapping software; and
- a compare module for comparing said fail memory locations derived by said logical-to-physical mapping software to said various predetermined memory locations to verify the accuracy of said logical-to-physical mapping software, and for concluding said logical-to-physical mapping software as defective when said fail memory locations derived by said logical-to-physical mapping software do not match up with said various predetermined memory locations.

16. The apparatus of claim 15, wherein said apparatus further includes a first register in said BIST fail control function to store said various predetermined memory locations of said simulated memory fails.

17. The apparatus of claim 15, wherein said apparatus further includes a second register in said BIST fail control function to store a bit for indicating whether or not a simulated memory fail should be induced.

18. The apparatus of claim 17, wherein said apparatus further includes means for inducing a simulated memory fail only during a read operation of said memory array.

19. The apparatus of claim 15, wherein said means for testing further includes
- means for sequentially executing a predetermined sequence of BIST cycles on said memory array while collecting cycle numbers of all failing BIST cycles on said memory array; and
- means for sequentially executing said predetermined sequences of BIST cycles while injecting said multiple simulated memory fails at said predetermined locations within said memory array.

20. The apparatus of claim 15, wherein said BIST unit further includes means for generating a simulated memory fail signal by combining a signal from said memory array and a signal from said BIST fail control function.

21. The apparatus of claim 20, wherein said means for generating is an XOR gate.

* * * * *